United States Patent
Fox et al.

(10) Patent No.: US 11,326,983 B2
(45) Date of Patent: May 10, 2022

(54) CIRCUIT RETAINER SYSTEMS

(71) Applicant: Hamilton Sundstrand Corporation, Charlotte, NC (US)

(72) Inventors: Brennan Fox, Geneseo, IL (US); Lon R. Hoegberg, Belvidere, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 199 days.

(21) Appl. No.: 16/736,273

(22) Filed: Jan. 7, 2020

(65) Prior Publication Data

US 2021/0208025 A1 Jul. 8, 2021

(51) Int. Cl.
*G01M 13/00* (2019.01)
*G01L 5/00* (2006.01)
*H05K 7/14* (2006.01)

(52) U.S. Cl.
CPC ........... *G01M 13/00* (2013.01); *G01L 5/0028* (2013.01); *H05K 7/14* (2013.01); *H05K 7/1401* (2013.01); *H05K 7/1404* (2013.01); *H05K 7/1409* (2013.01); *H05K 7/1417* (2013.01)

(58) Field of Classification Search
CPC ... G01M 13/00; G01L 5/0028; H05K 7/1404; H05K 7/14; H05K 7/1401–1409; H05K 7/1417
See application file for complete search history.

(56) References Cited

U.S. PATENT DOCUMENTS

| | | | | |
|---|---|---|---|---|
| 4,775,260 A * | 10/1988 | Kecmer | ............... | F16B 2/14 |
| | | | | 361/801 |
| 4,823,951 A * | 4/1989 | Colomina | ............ | H05K 7/1404 |
| | | | | 206/707 |
| 5,262,587 A | 11/1993 | Moser | | |
| 5,382,175 A | 1/1995 | Kunkel | | |
| 5,711,628 A * | 1/1998 | Fletcher | ............... | F16B 2/04 |
| | | | | 403/31 |
| 7,255,376 B2 | 8/2007 | Pratt et al. | | |
| 7,578,475 B2 | 8/2009 | Pratt et al. | | |
| 9,814,169 B2 * | 11/2017 | Mastrocola | ............ | H05K 13/04 |
| 10,129,996 B2 * | 11/2018 | Rozzi | ............... | H05K 7/1404 |
| 2006/0226944 A1 | 10/2006 | Breindel | | |
| 2011/0184666 A1 | 7/2011 | Imai et al. | | |
| 2017/0055382 A1 * | 2/2017 | Mastrocola | ............ | H05K 7/1404 |

(Continued)

FOREIGN PATENT DOCUMENTS

| | | |
|---|---|---|
| CN | 106989855 A | 7/2017 |
| CN | 107949232 A | 4/2018 |
| CN | 109141840 A | 1/2019 |

OTHER PUBLICATIONS

Extended European search report issued in corresponding EP application No. 21150502.9 dated May 28, 2021.

*Primary Examiner* — Jonathan M Dunlap

(74) *Attorney, Agent, or Firm* — Locke Lord LLP; Scott D. Wofsy; Daniel J. Fiorello

(57) ABSTRACT

A circuit retaining system can include a contact monitoring system configured to determine if a retainer is providing at least a selected force and/or pressure to a circuit board when the retainer is retaining the circuit board. The contact monitoring system can include a force and/or pressure sensor configured to be disposed between the retainer and the circuit board and to output a force and/or pressure sensor signal indicating a contact force and/or pressure.

20 Claims, 3 Drawing Sheets

(56) References Cited

U.S. PATENT DOCUMENTS

2017/0257966 A1 9/2017 Rozzi et al.
2019/0056769 A1 2/2019 Looi
2019/0230808 A1 7/2019 Ditri et al.

* cited by examiner

100

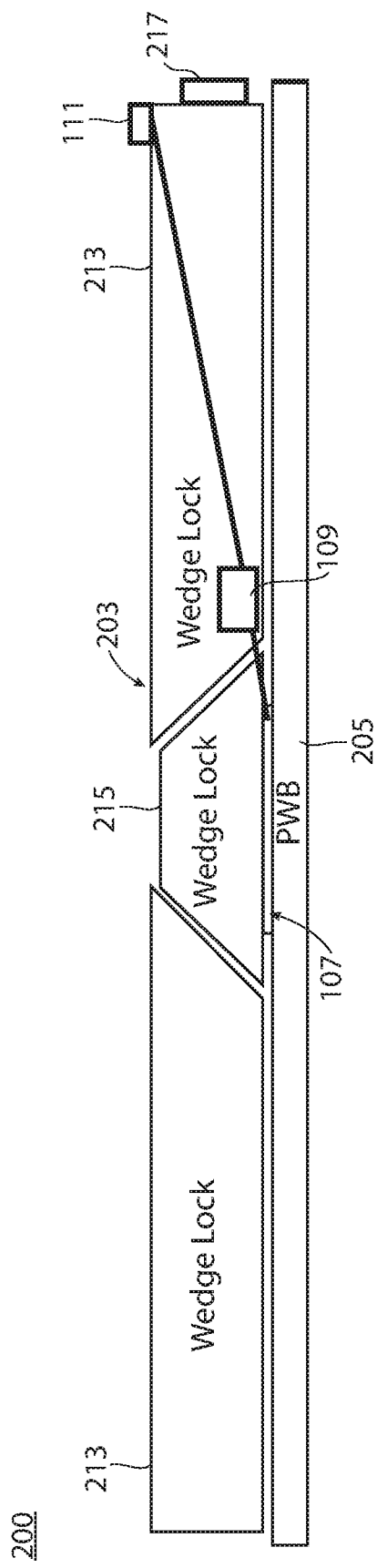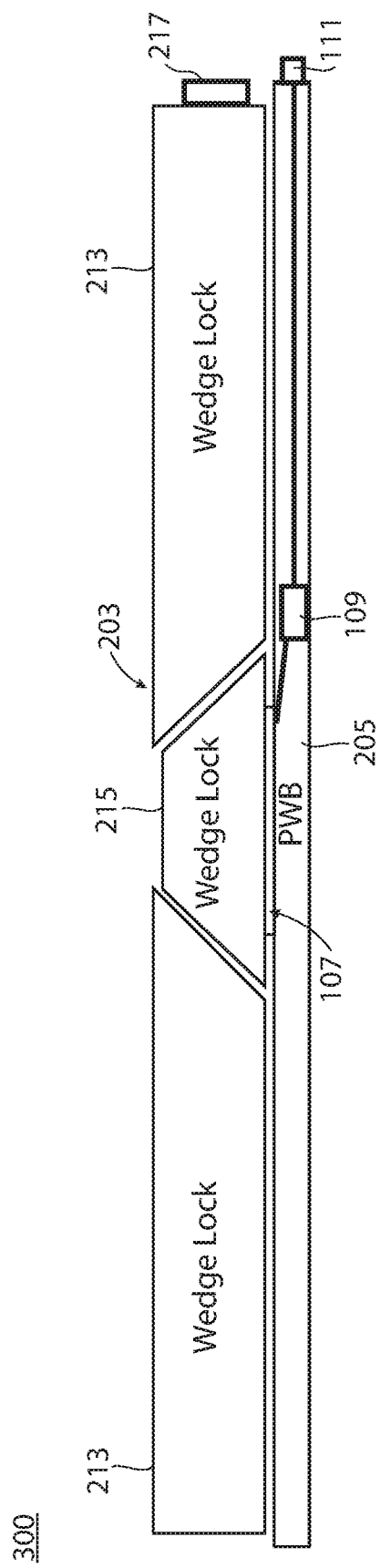

CIRCUIT RETAINER SYSTEMS

FIELD

This disclosure relates to circuit systems, e.g., circuit retainer systems therefor.

BACKGROUND

In circuit systems, wedge locks (e.g., for retaining circuit cards), for example, are often not fully engaged during assembly resulting in possibly poor thermal and electrical connection. This can cause unexpected operation and/or premature aging due to higher operational temperatures. The same issues can be present for a line replaceable unit (LRU) swing bolts, for example.

Such conventional methods and systems have generally been considered satisfactory for their intended purpose. However, there is still a need in the art for improved circuit retainer systems. The present disclosure provides a solution for this need.

SUMMARY

A circuit retaining system can include a contact monitoring system configured to determine if a retainer is providing at least a selected force and/or pressure to a circuit board when the retainer is retaining the circuit board. The contact monitoring system can include a force and/or pressure sensor configured to be disposed between the retainer and the circuit board and to output a force and/or pressure sensor signal indicating a contact force and/or pressure.

The contact monitoring system can include a monitor module configured to receive the force and/or pressure sensor signal and to determine if a contact force and/or pressure is at least the selected force and/or pressure. The monitor module can be configured to output a monitor state when the contact force and/or pressure is at least the selected force and/or pressure. The monitor module can include any suitable hardware module(s) and/or software module(s) configured to perform any suitable function, e.g., disclosed herein.

The selected force and/or pressure can be a contact force and/or pressure at or above a threshold pressure. The selected force and/or pressure can be a contact force and/or pressure at or below a threshold pressure.

The contact monitoring system can include an indicator configured to receive the monitor state and to indicate that the monitor module is outputting the monitor state. The indicator can be an LED, for example. In certain embodiments, the indicator can be a display configured to display a pressure value of the contact force and/or pressure. Any other suitable indicator(s) (e.g., a display) and/or combinations thereof are contemplated herein.

In certain embodiments, the circuit retaining system can include the retainer configured to retain the circuit board against another component. In certain embodiments, the contact monitoring system can be disposed on the retainer.

In certain embodiments, circuit retaining system can include the circuit board. The contact monitoring system can be disposed on the circuit board.

In certain embodiments, the retainer can be a wedge lock retainer. In certain embodiments, the force and/or pressure sensor can be disposed between a wedge of the wedge lock retainer and the circuit board. For example, the force and/or pressure sensor can be connected to the wedge of the wedge lock retainer. In certain embodiments, the force and/or pressure sensor can be disposed between the wedge lock retainer and a swing bolt.

In accordance with at least one aspect of this disclosure, a circuit assembly can include a circuit board, a retainer configured to retainer the circuit board, and a circuit retaining system as disclosed herein, e.g., as described above. Any suitable circuit retaining system in accordance with this disclosure is contemplated herein.

In accordance with at least one aspect of this disclosure, a method can include monitoring a force and/or pressure sensor to determine if a contact force and/or pressure between a retainer and a circuit board is a predetermined value or within a predetermined range of values, and activating or deactivating an indicator if the contact force and/or pressure is of the predetermined value or within the predetermined range of values. In certain embodiments, activating or deactivating the indicator can include turning on an LED or turning of an LED when the contact force and/or pressure is of the predetermined value or within the predetermined range of values.

These and other features of the embodiments of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein:

FIG. 2 is a schematic diagram of an embodiment of a circuit assembly in accordance with this disclosure;

FIG. 3 is a schematic diagram of an embodiment of a circuit assembly in accordance with this disclosure.

DETAILED DESCRIPTION

Figure 1:
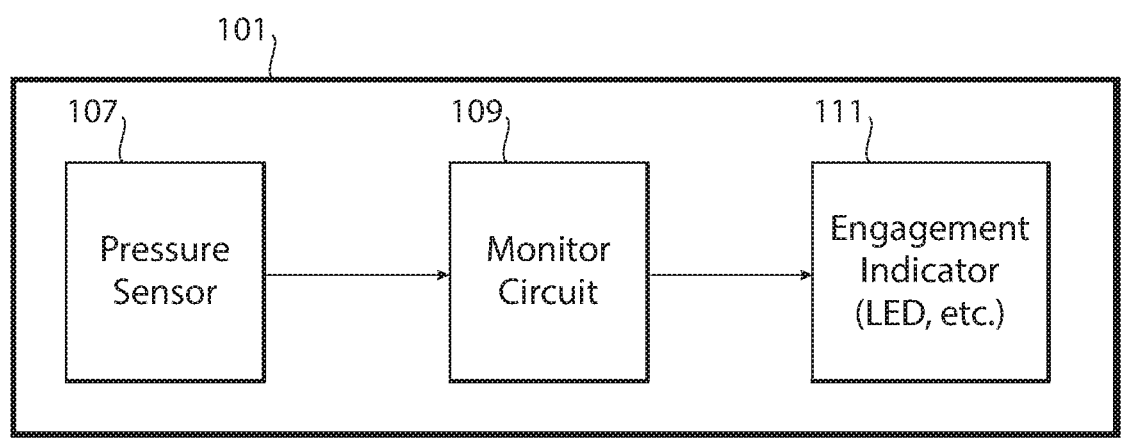
FIG. 1 is a schematic diagram of an embodiment of a circuit retaining system in accordance with this disclosure.
Figure 4:
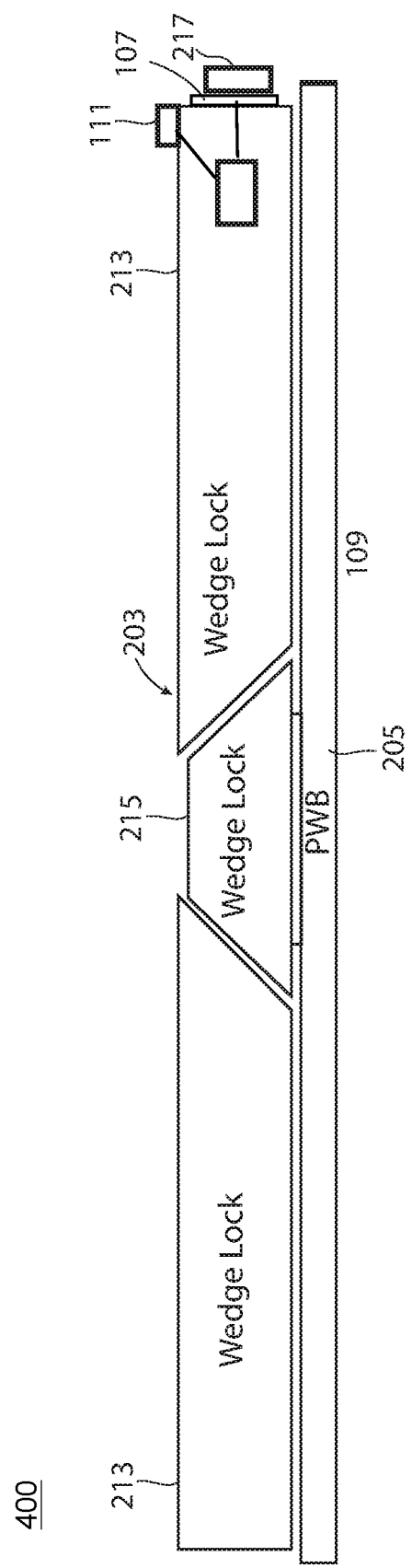
FIG. 4 is a schematic diagram of an embodiment of a circuit assembly in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-4. Certain embodiments described herein can be used to determine if a circuit card is sufficiently retained (e.g., in a circuit assembly that the circuit card inserts into).

Referring to FIGS. 1-4, a circuit retaining system 100 can include a contact monitoring system 101 configured to determine if a retainer 203 is providing at least a selected force and/or pressure to a circuit board 205 when the retainer 203 is retaining the circuit board 205 (e.g., in electrical and/or thermal engagement with a receiving circuit board, not shown). The contact monitoring system 101 can include a force and/or pressure sensor 107 configured to be disposed between the retainer 203 and the circuit board 205 and to output a force and/or pressure sensor signal indicating a contact force and/or pressure (e.g., between the retainer 203 and the circuit board 205).

The contact monitoring system 101 can include a monitor module 109 configured to receive the force and/or pressure sensor signal and to determine if a contact force and/or pressure is at least the selected force and/or pressure. The monitor module 109 can be configured to output a monitor state (e.g., a monitor signal or lack thereof) when the contact force and/or pressure is at least the selected force and/or pressure. Any other suitable pressure(s) to output the monitor state is contemplated herein. The monitor module 109 can include any suitable hardware module(s) and/or software module(s) configured to perform any suitable function, e.g., disclosed herein.

The selected force and/or pressure can be a contact force and/or pressure at or above a threshold pressure. For example, if the pressure is at or above the threshold, the monitor module 109 can output the monitor state. In certain embodiments, the selected force and/or pressure can be a contact force and/or pressure at or below a threshold pressure. For example, in such embodiments, if the pressure is at or below the threshold, the monitor module 109 can output the monitor state. Any other suitable logic or combination thereof (e.g., having a high threshold and a low threshold to indicate pressure within a range) is contemplated herein.

The contact monitoring system 101 can include an indicator 111 configured to receive the monitor state (e.g., a signal or lack thereof) and to indicate that the monitor module 109 is outputting the monitor state. The indicator 111 can be an LED, for example. In certain embodiments, the indicator 111 can be a display configured to display a pressure value of the contact force and/or pressure. Any other suitable indicator(s) (e.g., a display, an audible indicator, a tactile indicator) and/or combinations thereof are contemplated herein.

The contact monitoring system 101 can include any other suitable components desired. For example, the contact monitoring system 101 can include a battery and/or any other suitable power supply system configured to provide power to the monitor module 109 and/or the indicator 111.

In certain embodiments, the circuit retaining system 100 can include the retainer 203 configured to retain the circuit board 205 against another component (e.g., another circuit such as a motherboard). In certain embodiments, the contact monitoring system 100 can be disposed on the retainer, e.g., as shown in assembly 200 of FIG. 2.

In certain embodiments, the retainer 203 can be a wedge lock retainer, e.g., as shown in FIGS. 2 and 3. The wedge lock retainer can include two or more axial drive members 213 configured to push against a wedge 215 to push the wedge 215 against the circuit board 205 when an axial screw 217 (e.g., a swing bolt) is turned to pull the axial drive members 213 together. Any suitable wedge lock or any other suitable retainer (e.g., a swing bolt) is contemplated herein.

In certain embodiments, the force and/or pressure sensor 107 can be disposed between the wedge 215 of the wedge lock retainer and the circuit board 205, e.g., as shown. For example, the force and/or pressure sensor 107 can be connected to the wedge 215 of the wedge lock retainer. In certain embodiments, as shown in FIG. 4, the force and/or pressure sensor 107 can be disposed between the wedge lock retainer and the axial screw 217 (e.g., a swing bolt) to sense the force and/or pressure applied to the wedge lock retainer which can correlate to the force applied to the wedge, for example. Any other suitable location of the force and/or pressure sensor 107 configured to allow determination whether a suitable force and/or pressure is being supplied, directly or indirectly, to the circuit board 205 is contemplated herein.

As shown in FIGS. 2 and 4, the retainer 203 can include the monitor module 109 and the indicator 111 also attached thereto (e.g., connected to a surface of or within a component of the wedge lock). In certain embodiments, the indicator 111 can be disposed at an end of the axial drive member 213 at or near where the axial screw 217 is located, e.g., as shown, such that the indicator 111 is visible at least when the axial screw 217 is visible (e.g., which can allow sight of the indicator 111 in tight spaces).

In certain embodiments, circuit retaining system 100 can include the circuit board 205, e.g., as shown in circuit assembly 300 of FIG. 3. The contact monitoring system 101 can be disposed on the circuit board 205, for example. In certain embodiments, the monitoring module 109 can be integrated with the circuit board 205 such that it is a module of, part of a module, and/or hosted on a module of the circuit board 205. The indicator 111 can also be integrated with the circuit board 205, e.g., as shown, such that it is visible at an end of the circuit board 205. Any other suitable arrangement is contemplated herein.

In accordance with at least one aspect of this disclosure, a circuit assembly, e.g., 200, 300 as shown in FIGS. 2 and 3 can include a circuit board 205, a retainer 203 configured to retainer the circuit board, and a circuit retaining system 100 as disclosed herein, e.g., as described above. Any suitable circuit retaining system in accordance with this disclosure is contemplated herein.

In accordance with at least one aspect of this disclosure, a method can include monitoring a force and/or pressure sensor to determine if a contact force and/or pressure between a retainer and a circuit board is a predetermined value or within a predetermined range of values, and activating or deactivating an indicator if the contact force and/or pressure is of the predetermined value or within the predetermined range of values. In certain embodiments, activating or deactivating the indicator can include turning on an LED or turning of an LED when the contact force and/or pressure is of the predetermined value or within the predetermined range of values.

Embodiments disclosed herein can provide wedge lock engagement sensing. As disclosed above, embodiments can include a force and/or pressure sensor underneath a wedge lock or other retainer that gives reading of pressure when compressed, for example. As disclosed above, embodiments can utilize force and/or pressure sensors to determine if the wedge locks or swing bolts (e.g., 217) are fully engaged. The force and/or pressure sensor and/or system can be integrated onto the retainer or the circuit board. In certain embodiments, the force and/or pressure sensor can be a circuit board component (e.g., a silicone die). Embodiments can include a monitor circuit for sensing pressure and determining if down pressure is sufficient. Sensor signals can be electrical feedback to a module (e.g., a processor) of the circuit board (e.g., an LRU) or used with a physical indicator, e.g., such as a visual or audible indictor. For example, an indicator, e.g., an LED can be turned off from an on state when enough pressure is present (e.g., a light can be turned on while installing until pressure is sufficient) and/or could read out pressure to a display for a user to visually see if pressure is high enough. In certain embodiments, the contact monitoring system can be entirely separate and attach to the retainer and/or the circuit board in the field.

Embodiments can provide improved field reliability, user satisfaction, and fewer zero hour returns. Data from the force and/or pressure sensor can also be used for preventative health monitoring, for example.

As will be appreciated by those skilled in the art, aspects of the present disclosure may be embodied as a system, method or computer program product. Accordingly, aspects of this disclosure may take the form of an entirely hardware embodiment, an entirely software embodiment (including firmware, resident software, micro-code, etc.), or an embodiment combining software and hardware aspects, all possibilities of which can be referred to herein as a "circuit," "module," or "system." A "circuit," "module," or "system" can include one or more portions of one or more separate physical hardware and/or software components that can together perform the disclosed function of the "circuit," "module," or "system", or a "circuit," "module," or "system" can be a single self-contained unit (e.g., of hardware and/or software). Furthermore, aspects of this disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of this disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the this disclosure may be described above with reference to flowchart illustrations and/or block diagrams of methods, apparatus (systems) and computer program products according to embodiments of this disclosure. It will be understood that each block of any flowchart illustrations and/or block diagrams, and combinations of blocks in any flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in any flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified herein.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the subject disclosure includes reference to certain embodiments, those skilled in the art will readily appreciate that changes and/or modifications may be made thereto without departing from the spirit and scope of the subject disclosure.

What is claimed is:

1. A circuit retaining system, comprising:
a contact monitoring system configured to determine if a retainer is providing at least a selected force and/or pressure to a circuit board when the retainer is retaining the circuit board,
wherein the contact monitoring system is disposed on the circuit board.

2. The system of claim 1, wherein the contact monitoring system includes a force and/or pressure sensor configured to be disposed between the retainer and the circuit board and to output a force and/or pressure sensor signal indicating a contact force and/or pressure.

3. The system of claim 2, wherein the contact monitoring system includes a monitor module configured to receive the force and/or pressure sensor signal and to determine if a contact force and/or pressure is at least the selected force and/or pressure, wherein the monitor module is configured to output a monitor state when the contact force and/or pressure is at least the selected force and/or pressure.

4. The system of claim 3, wherein the selected force and/or pressure is a contact force and/or pressure at or above a threshold pressure.

5. The system of claim 3, wherein the selected force and/or pressure is a contact force and/or pressure at or below a threshold pressure.

6. The system of claim 3, wherein the contact monitoring system further includes an indicator configured to receive the monitor state and to indicate that the monitor module is outputting the monitor state.

7. The system of claim 6, wherein the indicator is a visual or audible indicator.

8. The system of claim 6, wherein the indicator is a display configured to display a pressure value of the contact force and/or pressure.

9. The system of claim 6, further comprising the retainer configured to retain the circuit board against another component, wherein the contact monitoring system is disposed on the retainer.

10. The system of claim 6, wherein the retainer is a wedge lock retainer.

11. The system of claim 10, wherein the force and/or pressure sensor is disposed between a wedge of the wedge lock retainer and the circuit board, or wherein the force and/or pressure sensor is disposed between the wedge lock retainer and a swing bolt.

12. The system of claim 11, wherein the force and/or pressure sensor is connected to the wedge of the wedge lock retainer.

13. A circuit assembly, comprising:
a circuit board;
a retainer configured to retain the circuit board against another component; and
a circuit retaining system having a contact monitoring system configured to determine if a retainer is providing at least a selected force and/or pressure to a circuit board when the retainer is retaining the circuit board,
wherein the contact monitoring system is disposed on the circuit board.

14. The system of claim 13, wherein the contact monitoring system includes a force and/or pressure sensor configured to be disposed between the retainer and the circuit board and to output a force and/or pressure sensor signal indicating a contact force and/or pressure.

15. The system of claim 14, wherein the contact monitoring system includes a monitor module configured to receive the force and/or pressure sensor signal and to determine if a contact force and/or pressure is at least the selected force and/or pressure, wherein the monitor module is configured to output a monitor state when the contact force and/or pressure is at least the selected force and/or pressure.

16. The system of claim 15, wherein the selected force and/or pressure is a contact force and/or pressure at or above a threshold pressure.

17. The system of claim 15, wherein the selected force and/or pressure is a contact force and/or pressure at or below a threshold pressure.

18. A circuit retaining system, comprising:
a contact monitoring system configured to determine if a retainer is providing at least a selected force and/or pressure to a circuit board when the retainer is retaining the circuit board,
wherein the retainer is a wedge lock retainer.

19. The system of claim 18, wherein the force and/or pressure sensor is disposed between a wedge of the wedge lock retainer and the circuit board, or wherein the force and/or pressure sensor is disposed between the wedge lock retainer and a swing bolt.

20. The system of claim 19, wherein the force and/or pressure sensor is connected to the wedge of the wedge lock retainer.

* * * * *